(12) United States Patent
Thielmann et al.

(10) Patent No.: US 6,348,656 B1
(45) Date of Patent: Feb. 19, 2002

(54) HOUSING FOR RECEIVING ELECTRICAL AND/OR ELECTRONIC BUILT-INS

(75) Inventors: Bodo Thielmann, Herborn-Merkenbach; Matthias Müller, Haiger, both of (DE)

(73) Assignee: Rittal-Werk Rudolf Loh GmbH & Co. KG, Herborn (DE)

( * ) Notice: Subject to any disclaimer, the term of this patent is extended or adjusted under 35 U.S.C. 154(b) by 0 days.

(21) Appl. No.: 09/687,442

(22) Filed: Oct. 13, 2000

(30) Foreign Application Priority Data

Oct. 15, 1999 (DE) .......................................... 199 49 879

(51) Int. Cl.⁷ ................................................. H02G 3/08
(52) U.S. Cl. ........................ 174/50; 312/265.1; 361/600
(58) Field of Search .............................. 174/50, 58, 60, 174/63; 312/223.1, 223.6, 265.1, 265.2, 265.3, 265.4, 265.5; 361/826, 827, 724, 600; 220/402

(56) References Cited

U.S. PATENT DOCUMENTS

| | | | |
|---|---|---|---|
| 1,919,986 A | * | 7/1933 | Powers |
| 5,574,251 A | * | 11/1996 | Sevier .......................... 174/50 |
| 5,889,648 A | * | 3/1999 | Heavirland et al. ......... 361/600 |
| 6,005,188 A | * | 12/1999 | Teichler et al. ........ 220/4.02 X |
| 6,169,248 B1 | * | 1/2001 | Rowe et al. ................... 174/50 |
| 6,218,615 B1 | * | 4/2001 | Canonico .................. 174/58 X |

FOREIGN PATENT DOCUMENTS

GB 2179501 * 3/1987 .................. 174/50

OTHER PUBLICATIONS

"Rittal Handbuch 29" [Rittal Handbook] from Rittal–Werk Rudolf Loh GmbH & Co. KG, Herborn, Germany, p. 597.

* cited by examiner

Primary Examiner—Dean A Reichard
Assistant Examiner—Dhiru R Patel
(74) Attorney, Agent, or Firm—Pauley Petersen Kinne & Erickson

(57) ABSTRACT

A housing for receiving electrical and/or electronic built-in units, having a rack. The housing has vertical frame legs at least in corner areas, wherein an opening is formed between the two frame legs at a front of the rack, through which the housing interior is accessible. A blind frame has vertically extending profiled screening sections which cover the vertical profiled frame sections at least partially and is pivotally connected to the front of the rack. In order to increase the options for outfitting the switchgear cabinet and/or the technical switchgear equipment in the area of the opening at the front, a separate profiled function section extending in the linear profile direction is connected to the profiled screening section and has at least one function projection protruding toward the switchgear cabinet interior.

14 Claims, 3 Drawing Sheets

HOUSING FOR RECEIVING ELECTRICAL AND/OR ELECTRONIC BUILT-INS

BACKGROUND OF THE INVENTION

1. Field of the Invention

This invention relates to a housing for receiving electrical and/or electronic built-ins, having a rack with vertical frame legs at least in the corner areas. An opening is formed between the two frame legs at the front through which the housing interior is accessible. A blind frame, which has vertically extending profiled screening sections covering the vertical profiled frame sections at least partially, is pivotally connected to a front of the rack.

2. Description of Related Art

A housing having a rack is disclosed on page 597 of a company prospectus "Rittal Handbuch 29" [Rittal Handbook] from Rittal-Werk Rudolf Loh GmbH & Co. KG, Herborn, Germany. Vertical profiled frame sections are provided in the corner areas of the rack. Fastening rails can be installed on the two profiled frame sections located at the front. The fastening rails extend in a direction of the linear extension of the vertical profiled frame sections and project with a bar having fastening receivers into an opening area formed between the two profiled frame sections. Component supports can be fastened on the bars. A blind frame is hinged to one of the two vertical profiled frame sections. The blind frame has four profiled screening sections that cover the horizontal and vertical profiled frame sections located at the front of the rack.

SUMMARY OF THE INVENTION

It is one object of this invention to provide a housing of the type mentioned above but wherein the options for outfitting the switchgear cabinet and/or the technical switchgear equipment are increased.

This object is achieved with a separate profiled function section extending in the linear profile direction that is connected to the profiled screening section and is equipped with at least one function projection protruding in the direction toward the switchgear cabinet interior.

Use of the function projection makes it possible to increase the functionality of the blind frame. It is also possible to use profiled function sections of different design and functionality, which are distributed over a length of the profiled screening section. The profiled function sections can have holding, sealing, clamping and/or visual screening functions, for example.

In accordance with a preferred embodiment of this invention, the function projection at least partially visually screens or blocks the area of the associated vertical profiled frame section facing the opening of the rack located at the front. Thus, the vertical profiled frame section can no longer be observed, at least partially, through the closed blind frame.

In a further preferred embodiment, the function projection has a holder with one or several fastening receivers for fastening additions.

In this case the profiled function section can also be designed so that the fastening receiver designed as an undercut groove is cut into the holder. The groove extends in the linear direction of the vertical profiled frame section and the holder is connected in one piece with the function projection. It is then possible, for example, to displace infinitely variable sliding blocks, which are used for fastening purposes, in the groove.

A housing in accordance with this invention can also have vertically extending mounting rails fastened on the front of the rack, which are associated with the two vertical profiled frame sections at the front and which extend with a bar into the area of the opening at the front or into the housing interior. The bar has a row of fastening receivers. Additions, for example plates, can be fastened on the fastening receivers with fastening elements. The fastening elements are covered toward the front face of the rack with the profiled function section. When the blind frame is closed, the profiled function sections block access to the fastening means. Unauthorized manipulation thus is more difficult. The profiled function sections are simultaneously used for the visual screening of the fastening elements.

The profiled function section can also be used for improving the IP type of protection. For example, the function projection can support a sealing element extending in the direction of the linear extension of the profiled function section which is, with the blind frame closed, placed on a plate connected to the rack and which at least partially covers the front opening of the rack.

The visual screening of the vertical profiled frame section of the rack can also be improved if the vertical profiled frame sections of the blind frame have an angled-off section, which at least partially covers the exterior of the vertical profiled frame section in the area of the outer corner of the rack.

In order to exactly align the profiled function section with respect to the blind frame, the profiled function section can have two legs arranged at an angle with respect to each other, which form an interior receiver. The profiled function section is inserted with the interior receiver into a complimentary designed exterior receiver of the profiled screening section. One of the legs has at least one screw receiver into which a fastening screw is inserted and screwed into a threaded receiver of the profiled screening section.

BRIEF DESCRIPTION OF THE DRAWINGS

This invention is explained in greater detail in view of embodiments represented in the drawings, wherein.

DESCRIPTION OF PREFERRED EMBODIMENTS

Figure 1:
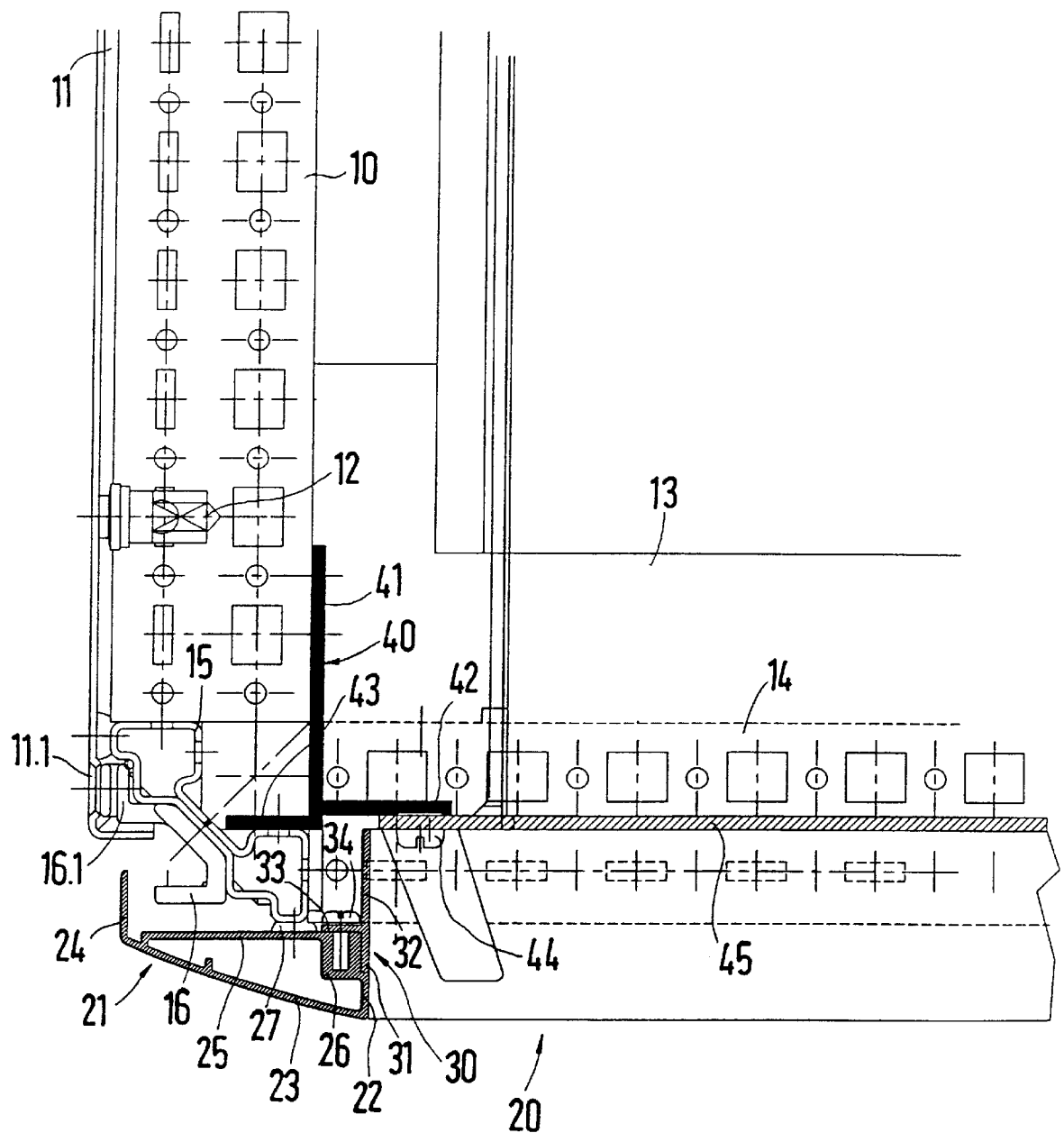
FIG. 1 shows a portion of a rack in a horizontal section and in a top view, with a blind frame at the front.

A portion of a rack of a switchgear cabinet is shown in FIG. 1. The rack has bottom frames and cover frames, which are embodied identical to each other. As shown in FIG. 1, the bottom frame has depth struts 10 extending in a direction of a depth of the switchgear cabinet, to which are attached width struts 14 extending at right angles in the direction of the width of the switchgear cabinet. The bottom frame is fastened on the floor by means of a pedestal 13. Vertical profiled frame sections 15 are attached to the corner area of the bottom frame. The open sides of the rack can be covered by lateral walls 11. Lateral wall holders 16 are installed on the vertical profiled frame sections 15 for fastening the lateral walls 11. The lateral wall holders 16 have fastening arms 16.1, which have a threaded receiver. A screw receiver 11.1 is cut into the lateral wall 11 and is aligned with the threaded receiver. A fastening screw can be passed through the screw receiver 11.1 and screwed into the threaded receiver of the fastening arm 16.1.

As shown in FIG. 1, welding bolts 12 are fastened on an inside of the lateral wall 11 facing the switchgear cabinet interior and assume fastening functions.

An opening is formed between the two vertical profiled frame sections 15 on the front, through which the interior of the switchgear cabinet can be accessed. Vertical mounting rails 40 are screwed in place on the vertical profiled frame sections 15 in the area of this opening at the front. The mounting rails 40 have a bar 41 extending in the direction of the depth of the switchgear cabinet. An arm 43 is angled off the bar 41 and is connected with the vertical profiled frame section 15. The bar 41 also supports a strip 42, which projects into the area of the opening at the front. The strip 42 has a row of fastening receivers which are evenly spaced apart from each other. Attachments can be fastened on the strip 42 with the fastening receivers. In the present exemplary embodiment, a plate 45 is fixed in place on the strip 42 by means of fastening screws 44. Customarily, 19" built-ins are fastened in place on the mounting rail 40.

A blind frame 20 is hinged on the front of the rack and can be pivoted about a vertical pivot axis. The blind frame 20 has two vertical profiled screening sections 21 and two horizontal profiled screening sections 46, wherein the vertical profiled screening sections 21 cover the vertical profiled frame sections 15, and the horizontal profiled screening sections 46 cover the width struts 14 in a direction toward the front. The profiled screening sections 21 have a lateral wall 22, which faces the opening at the front of the rack and supports a fastening block 26. The fastening block 26 has a threaded receiver, wherein the center linear axis of the threaded receiver extends in the direction toward the depth of the switchgear cabinet. The lateral wall 22 has a recess in the area of the fastening block 26. The function of this recess will be explained in detail later.

A sealing wall 25, which is at right angles with respect to the lateral wall 22, extends away from the fastening block 26. A seal 27 is applied to the sealing wall 25. In the closed state of the blind frame 20, the seal 27 rests against a sealing strip of the vertical profiled frame section 15. At the front, the lateral wall 22 is connected with the free end of the sealing wall 25 via a screening section 23. The screening section 23 is embodied in a visually pleasing design and is predominantly round. In its area facing the sealing wall 25, the screening section 23 transitions into an angled element 24, which extends in the direction of the depth of the rack and which laterally screens the vertical profiled frame section 15, at least partially.

A profiled function section 30 can be connected with the profiled screening section 21. The profiled function section 30 has two legs 31 and 33, which extend at right angles relative to each other. The leg 33 has a screw receiver, and a fastening screw 34 can be passed through the screw receiver and screwed into the threaded receiver of the fastening block 26. In the fastened state, the leg 31 rests against the recess in the lateral wall 22. Therefore the leg 31 makes a flush transition into the lateral wall 32 in a visually pleasing way. The leg 31 extends beyond the leg 33 by means of a function projection 32. The function projection 32 visually screens or blocks, in this particular embodiment. Because of the arrangement of the function projection 32, the vertical frame leg 15 is no longer visible through the opening enclosed by the blind frame 20.

In place of the profiled function section 30 shown in FIG. 1, it is also possible to attach further profiled function sections to the profiled screening section 21. During this the recess in the lateral wall 22 forms an interface for the differently designed profiled function sections 30.

Figure 2:
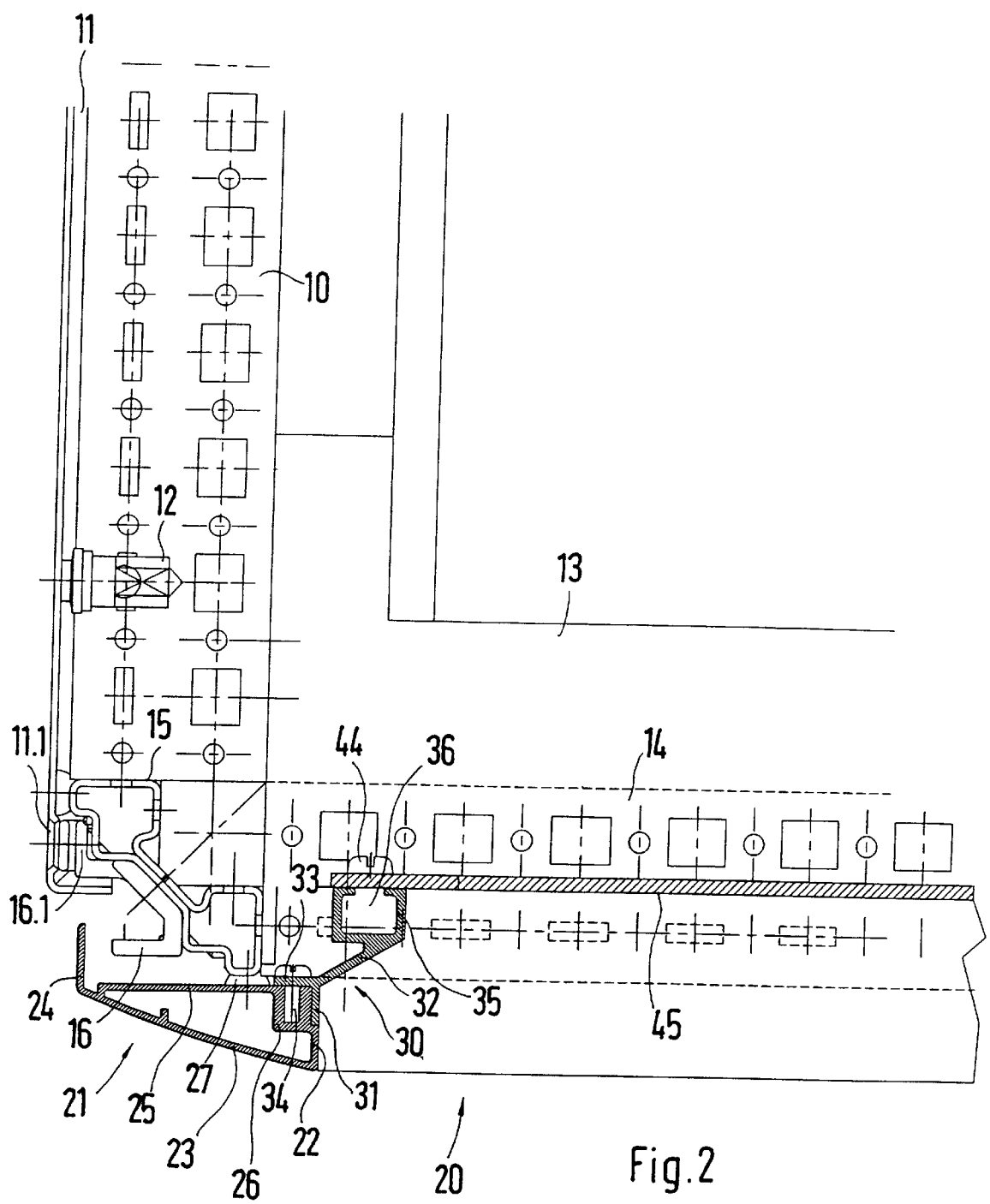
FIG. 2 shows a horizontal section and a top view of the rack in accordance with FIG. 1, with a changed blind frame.

A profiled function section 30 is shown in FIG. 2 which, following the legs 31 and 33, has a function projection 32 extending transversely with respect to the front plane of the switchgear cabinet. On its free end the profiled function section 30 supports a holder 35, which has a fastening receiver 34 embodied in the shape of a groove. In this case the groove extends parallel with respect to the linear extension of the vertical profiled frame section 15. Sliding blocks can be inserted into the groove, wherein the sliding blocks have threaded receivers. Attachments, for example a plate 45, can be fastened on the profiled functioning section 30 by means of the sliding blocks. Thus, fastening screws 44 are inserted into the screw receivers of the plate 45 and are screwed into the sliding blocks.

Figure 3:
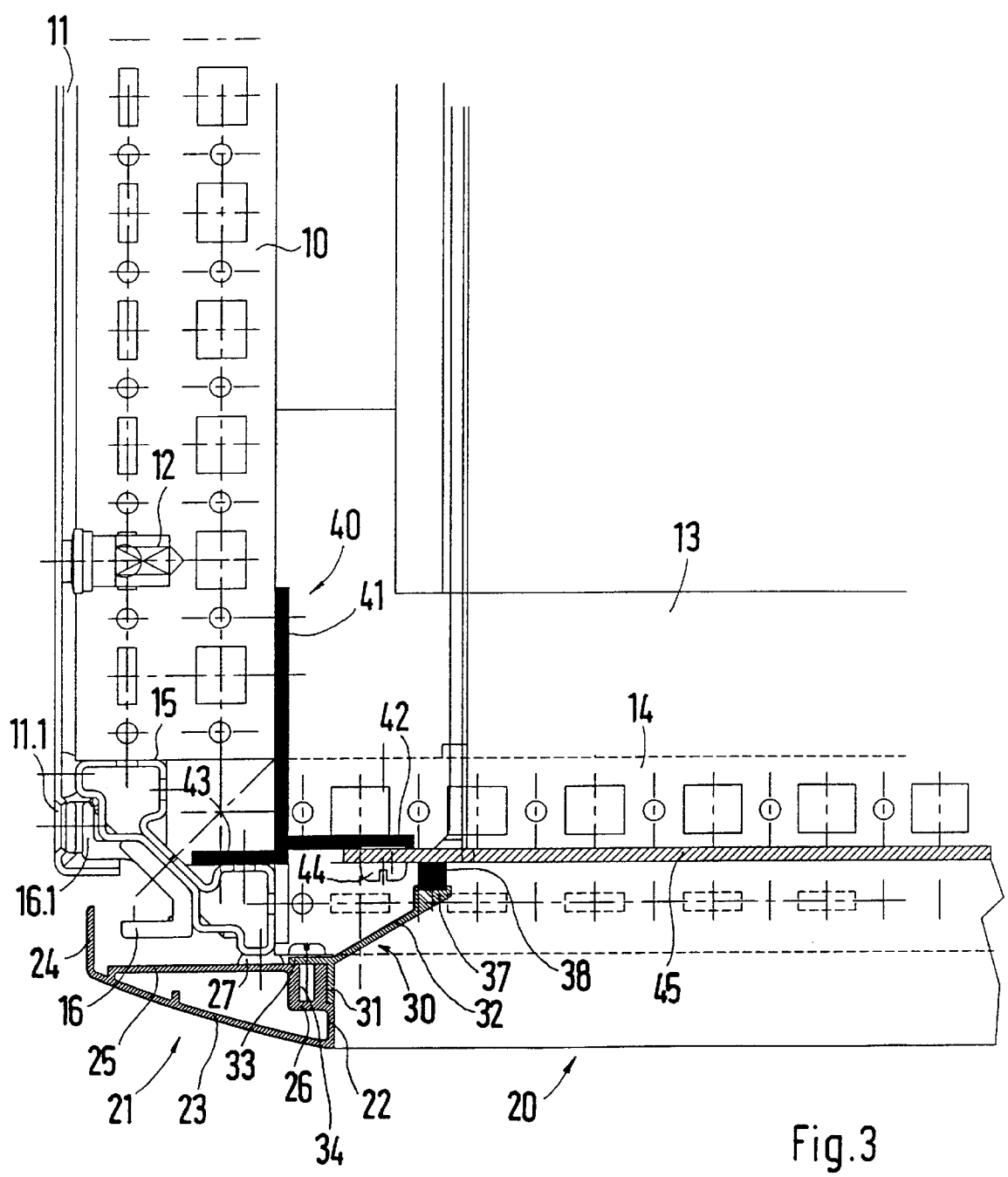
FIG. 3 shows a horizontal section and a top view of the rack in accordance with FIGS. 1 and 2, with a further embodiment of a blind frame.

As shown in FIG. 3, the profiled function section can also assume sealing functions. A plate 45 is fixed in place on the two vertical mounting rails 40 at the front. Thus, fastening screws 44 are passed through the plate 45 and are screwed into the strip 42 of the mounting rail 40. At the free end of the function projection 32, the profiled function section 30 has a thickening 37. A seal 38 is fixed in place on the thickening 37. In the closed position of the blind frame 20, the seal 38 rests on the front of the plate 45. The seal 38 is partially recessed into the thickening 37, or is guided, and in the closed state of the blind frame 20 flexibly screens the remaining gap to the plate 45 so that the thickness of the plate 45 can be varied. At the same time the function projection 32 provides a visual protection because it visually screens the vertical profiled frame section 15 and covers the fastening screws 44.

What is claimed is:

1. In a housing for receiving at least one of an electrical and an electronic built-in, having a rack with vertical frame legs at least in corner areas of the rack, wherein an opening is formed between two of the frame legs at a front of the rack through which an interior of the housing is accessible, and wherein a blind frame with at least two vertically extending profiled screening sections that at least partially cover vertical profiled frame sections is pivotally connected to the front of the rack, the improvement comprising:

a profiled function section (30) extending in a linear profile direction and connected to one of the profiled screening sections (21), and the profiled function section (30) having at least one function projection (32) protruding toward the housing interior.

2. In the housing in accordance with claim 1, wherein the at least one function projection (32) at least partially visually blocks an area of an associated one of the vertical profiled frame sections (15) facing the opening.

3. In the housing in accordance with claim 2, wherein the at least one function projection (32) has a holder (35) with at least one fastening receiver (36) for fastening a plate (45).

4. In the housing in accordance with claim 3, wherein the at least one fastening receiver (36) has an undercut groove within the holder (35), wherein the undercut groove extends in a linear direction of the vertical profiled frame sections (15), and the holder (35) is connected in one piece with the function projection (32).

5. In the housing in accordance with claim 4, wherein a plurality of vertically extending mounting rails (40) are fastened on the front of the rack and are associated with two of the vertical profiled frame sections (15) at the front and which extend with a bar (42) one of near the opening at the front and into the housing interior, the bar has a row of fastening receivers, the plate (45) is fastened on the fastening receivers by a plurality of fastening elements (44), and the fastening elements (44) are covered toward a front face of the rack with the profiled function section (30).

6. In the housing in accordance with claim 5, wherein the at least one function projection (32) supports a sealing element (38) extending in an extension direction of a linear extension of the profiled function section (30) which with a blind frame (20) closed is placed on the plate (45) connected to the rack and at least partially covers the opening of the rack.

7. In the housing in accordance with claim 6, wherein the vertically extending profiled screening sections (21) of the blind frame (20) have an angled-off section (24) which at least partially covers an exterior of one of the vertical profiled frame sections (15) at an outer corner of the rack.

8. In the housing in accordance with claim 7, wherein the profiled function section (30) has two legs (31, 33) arranged at an angle with respect to each other which form an interior receiver, the profiled function section (30) is inserted with the interior receiver into a complimentary exterior receiver of the vertically extending profiled screening sections (21), and one of the legs (33) has at least one screw receiver into which a fastening screw (34) is inserted and screwed into a threaded receiver of the profiled screening sections (21).

9. In the housing in accordance with claim 1, wherein the at least one function projection (32) has a holder (35) with at least one fastening receiver (36) for fastening a plate (45).

10. In the housing in accordance with claim 9, wherein the at least one fastening receiver (36) has an undercut groove within the holder (35), wherein the undercut groove extends in a linear direction of the vertical profiled frame sections (15), and the holder (35) is connected in one piece with the function projection (32).

11. In the housing in accordance with claim 1, wherein a plurality of vertically extending mounting rails (40) are fastened on the front of the rack and are associated with two of the vertical profiled frame sections (15) at the front and which extend with a bar (42) one of near the opening at the front and into the housing interior, the bar has a row of fastening receivers, a plate (45) is fastened on the fastening receivers by a plurality of fastening elements (44), and the fastening elements (44) are covered toward a front face of the rack with the profiled function section (30).

12. In the housing in accordance with claim 1, wherein the at least one function projection (32) supports a sealing element (38) extending in an extension direction of a linear extension of the profiled function section (30) which with a blind frame (20) closed is placed on a plate (45) connected to the rack and at least partially covers the opening of the rack.

13. In the housing in accordance with claim 1, wherein the vertically extending profiled screening sections (21) of the blind frame (20) have an angled-off section (24) which at least partially covers an exterior of one of the vertical profiled frame sections (15) at an outer corner of the rack.

14. In the housing in accordance with claim 1, wherein the profiled function section (30) has two legs (31, 33) arranged at an angle with respect to each other which form an interior receiver, the profiled function section (30) is inserted with the interior receiver into a complimentary exterior receiver of each of the vertically extending profiled screening sections (21), and one of the legs (33) has at least one screw receiver into which a fastening screw (34) is inserted and screwed into a threaded receiver of each of the profiled screening sections (21).

* * * * *